United States Patent [19]
Kim

[11] Patent Number: 5,447,882
[45] Date of Patent: Sep. 5, 1995

[54] METHOD FOR FABRICATING CAPACITOR OF SEMICONDUCTOR MEMORY DEVICE

[75] Inventor: Choon H. Kim, Ichon-kun, Rep. of Korea

[73] Assignee: Hyundai Electronics Industries Co., Ltd., Kyoungki-Do, Rep. of Korea

[21] Appl. No.: 347,954

[22] Filed: Dec. 1, 1994

[30] Foreign Application Priority Data

Dec. 1, 1993 [KR] Rep. of Korea ............... 93-26091

[51] Int. Cl.⁶ .......................................... H01L 21/8242
[52] U.S. Cl. ........................................ 437/60; 437/192; 437/919
[58] Field of Search ................ 437/60, 192, 919; 148/DIG. 14

[56] References Cited

U.S. PATENT DOCUMENTS 5,273,925 12/1993 Yamanaka ..................... 437/60
5,278,091 1/1994 Fazan et al. .................... 437/60
5,364,809 11/1994 Kwon et al. ................... 437/60

*Primary Examiner*—Chandra Chaudhari
*Attorney, Agent, or Firm*—Merchant, Gould, Smith, Edell, Welter & Schmidt

[57] ABSTRACT

A method for fabricating a capacitor of a semiconductor memory device, capable of forming a capacitor having a relatively high capacitance as compared to an occupied area of a corresponding memory cell and yet exhibiting a minimized topology, in a simplified manner, thereby achieving improvements in the reliability and integration degree of the semiconductor memory device by forming an interlayer insulating film over a semiconductor substrate, removing a selected portion of the interlayer insulating film to form a contact hole through which a predetermined surface portion of semiconductor substrate corresponding to a region defined as a contact for the capacitor is partially exposed, burying a tungsten in the contact hole to form a contact plug, forming a storage electrode on the interlayer insulating film such that the storage electrode is in contact with the contact plug, selectively etching the storage electrode to a predetermined depth to form a plurality of recesses at the storage electrode, and sequentially forming a dielectric film and a plate electrode over the entire exposed surface of the recessed storage electrode.

3 Claims, 2 Drawing Sheets

METHOD FOR FABRICATING CAPACITOR OF SEMICONDUCTOR MEMORY DEVICE

BACKGROUND OF THE INVENTION

1. Field of the Invention

The present invention relates to a method for fabricating a capacitor of a semiconductor memory device, and more particularly to such a method capable of fabricating a capacitor with a very large capacitance as compared to the occupied area of a memory cell and thereby achieving improvements in the reliability and integration degree of a semiconductor memory device.

2. Description of the Prior Art

Generally, a semiconductor memory device such as a dynamic random access memory (DRAM) comprises a plurality of memory cells so as to store a large quantity of information. The memory cells of the semiconductor memory device are arranged such that each of them is connected to each corresponding one of a plurality of word lines longitudinally arranged and to each corresponding one of a plurality of bit lines laterally arranged to be orthogonal to the word lines. Each of the memory cells includes a capacitor for storing electric charges therein and a field effect transistor for opening and closing charge and discharge passages of the capacitor. Each memory cell also includes a plate electrode and a storage electrode formed to be in contact with the field effect transistor. The plate electrode and the storage electrode are mainly made of polysilicon. A dielectric film is formed between the plate electrode and the storage electrode. The dielectric film may have a single layer structure constituted by an oxide film or a nitride film or a multi-layer structure such as an oxide-nitride-oxide (ONO) structure constituted by a combination of the oxide film and the nitride film. As such a DRAM has a higher integration degree, it is difficult to ensure a sufficient storage capacitance of each capacitor. This is because each memory cell of the DRAM has an abruptly reduced occupied area as the DRAM has the higher integration degree. Such a reduction in the occupied area of a memory cell results in a reduction in the surface area of a storage electrode included in each capacitor.

Meanwhile, the capacitance C of capacitor is determined on the basis of the following equation:

$$C = (\epsilon O \cdot \epsilon r \cdot A)/Tox \quad (1)$$

where, $\epsilon o$ represents the permittivity of vacuum, $\epsilon r$ the dielectric constant, A the area of the storage electrode of the capacitor and Tox the space defined between the storage electrode and the plate electrode. In order to increase the capacitance of capacitor expressed by the equation (1), there have been proposed various methods such as a method of forming the dielectric film of capacitor by use of a dielectric material exhibiting a high dielectric constant, a method of greatly reducing the space between the storage electrode of capacitor and the plate electrode, and a method of increasing the surface area of the storage electrode of capacitor. However, these methods have problems involved in themselves.

The dielectric material, such as $Ta_2O_5$, $TiO_2$ or $SrTiO_3$, exhibiting a high dielectric constant is difficult to apply to semiconductor memory devices because of its uncertain reliability and thin film characteristic such as insulation breakdown voltage. Where the space between the storage electrode and the plate electrode is reduced, the dielectric film interposed between the electrodes is reduced in thickness, so that it may be easily damaged during an operation of the memory cell. As a result, the reliability of capacitor is severely affected.

In order to increase the surface area of capacitor, there have also been proposed a method of forming a capacitor with a pin structure extending throughout a multi-layer structure of the capacitor to connect the layers with one another, a method of forming a capacitor with a cylindrical structure or a rectangular frame structure, and a method of forming a capacitor by use of a hemispherical grain polysilicon (HSG) process using polysilicon grains. Although the pin-shaped capacitor has an increased surface area by virtue of its multi-layer structure, the surface area is still small due to its reduction caused by the high integration of DRAM. As a result, the capacitance of this pin-shaped capacitor is still insufficient. The multi-layer structure rather causes a degradation in step coverage of layers subsequently formed. The cylindrical capacitor has an advantage of a low topology as compared to the pin-shaped capacitor. However, this cylindrical capacitor involves a degradation in integration degree because it occupies a large area in order to establish a sufficient capacitance in spite of its small surface area. Where the HSG process is used, an increase in surface area is obtained. In this case, however, there are problems of a difficulty in controlling the surface area and a complexity of the overall process.

SUMMARY OF THE INVENTION

Therefore, an object of the present invention is to solve the above-mentioned problems encountered in the prior art and, thus, to provide a method for fabricating a capacitor of a semiconductor memory device, capable of forming a capacitor having a relatively high capacitance as compared to an occupied area of a corresponding memory cell and yet exhibiting a minimized topology, in a simplified manner, thereby achieving improvements in the reliability and integration degree of the semiconductor memory device.

In accordance with the present invention, this object can be accomplished by providing a method for fabricating a capacitor of a semiconductor memory device, comprising the steps of: preparing a semiconductor substrate; forming an interlayer insulating film over the semiconductor substrate; removing a selected portion of the interlayer insulating film, thereby forming a contact hole through which a predetermined surface portion of semiconductor substrate corresponding to a region defined as a contact for the capacitor is partially exposed; burying a tungsten in the contact hole, thereby forming a contact plug; forming a storage electrode on the interlayer insulating film such that the storage electrode is in electrical contact with the contact plug; selectively etching the storage electrode to a predetermined depth, thereby forming at least two recesses at the storage electrode; and sequentially forming a dielectric film and a plate electrode over the entire exposed surface of the recessed storage electrode.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENT

FIGS. 1 to 5 are sectional views respectively explaining sequential steps of a method for fabricating a capacitor of a semiconductor memory device in accordance with an embodiment of the present invention.

Figure 1:
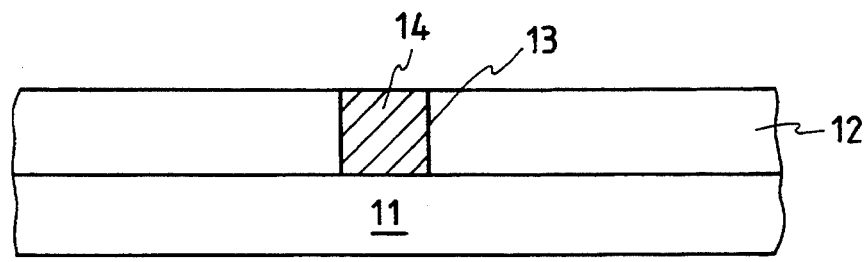
FIGS. 1 to 5 are sectional views respectively illustrating a method for fabricating a capacitor of a semiconductor memory device in accordance with an embodiment of the present invention.

Referring to FIG. 1, there is shown a semiconductor memory device including a semiconductor substrate 11 formed with an interlayer 12, and a contact plug electrically contacting the surface of semiconductor substrate 11. The interlayer 12 is comprised of an oxide film. The contact plug 14 is formed by removing a selected portion of the interlayer insulating film to form a contact hole 13, through which a predetermined surface portion of semiconductor substrate 11 corresponding to a region defined as a contact for a capacitor is partially exposed, and then burying a tungsten in the contact hole 13 by use of a selective deposition process. Since the tungsten exhibits a superior deposition selectivity to both the interlayer insulating film 12 and the semiconductor substrate 11, the surface of contact plug 14 is flush with the surface of interlayer insulating film 12, thereby forming a planarized surface. The formation of the contact hole 13 is achieved by coating a photoresist film (not shown) over the interlayer insulating film 12, subjecting the photoresist film to an exposure and a development by use of a mask for contact, thereby forming a photoresist film pattern, selectively etching the interlayer insulating film 12 by use of the photoresist film pattern as an etch barrier so as to expose the predetermined surface portion of semiconductor substrate 11, and then removing the photoresist film pattern. The contact plug 14 is disposed in the contact hole 13.

Figure 2:
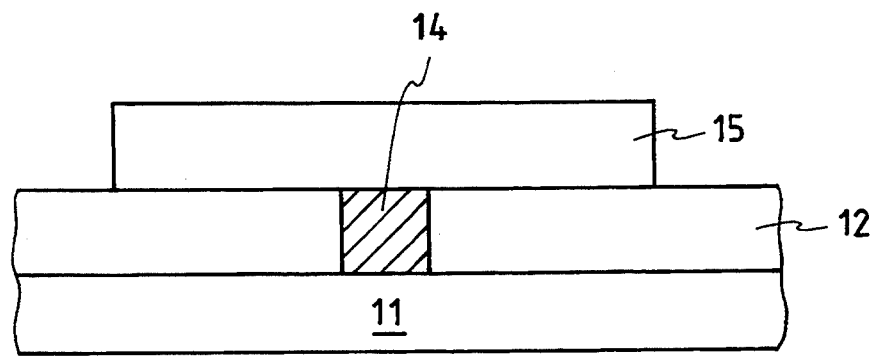

Referring to FIG. 2, the semiconductor memory device includes a storage electrode 15 formed on the interlayer insulating film 12 such that it is in electrical contact with the contact plug 14. The formation of the storage electrode 15 is carried out by forming a polysilicon layer to a predetermined thickness over the interlayer insulating film 12, and then patterning the polysilicon layer by use of a photolithography process.

Figure 3:
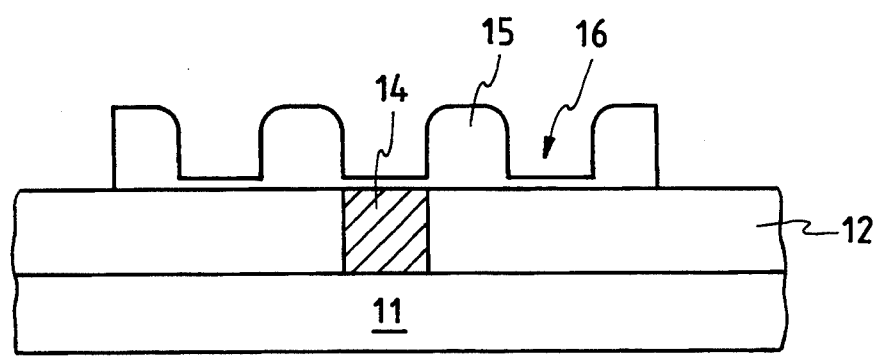

As shown in FIG. 3, the storage electrode 15 is selectively etched at its predetermined portions so that the portions are partially removed to a predetermined depth, thereby forming three recesses 16. By virtue of the recesses 16, the storage electrode 15 has a large surface area as compared to the occupied area of the corresponding memory cell. The etching of the storage electrode 15 is carried out such that the storage electrode 15 is not etched throughout its full thickness, thereby preventing the interlayer insulating film 12 from being exposed. In this case, the contact plug 14 enhances a process tolerance capable of overlapping one of the recesses 16 therewith because its surface is flush with the surface of interlayer insulating film 12.

Figure 4:
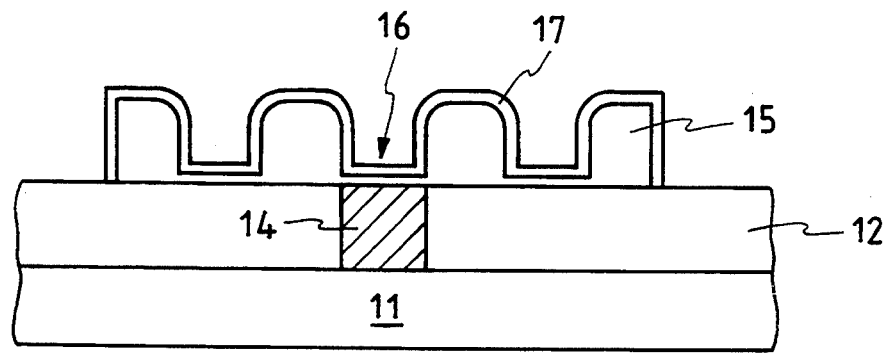

As shown in FIG. 4, the semiconductor memory device further includes a dielectric film 17 formed over the entire exposed surface of the storage electrode 15 including side wall surfaces and bottom surfaces of all recesses 16. The dielectric film 17 is formed by an oxide film, a nitride film and another oxide film, in this order, over the entire exposed surface of the storage electrode 15.

Figure 5:
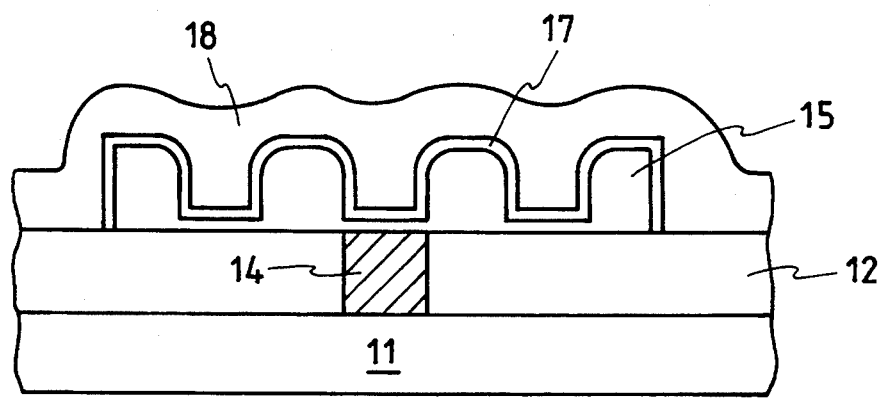

As shown in FIG. 5, the semiconductor memory device further includes a plate electrode 18 formed over the dielectric film 17. The formation of the plate electrode 18 is achieved by depositing a polysilicon over the dielectric film 17. The plate electrode 18 constitutes a capacitor, together with the dielectric film 17, the contact plug 14 and the storage electrode 15.

As apparent from the above description, the method of the present invention provides a capacitor having a plurality of recesses at a surface of its storage electrode in a simplified manner, thereby capable of increasing an effective surface area of the storage electrode for storing charge therein while minimizing the topology of the storage electrode. By virtue of such an increase in the effective surface area of the storage electrode, it is possible to fabricate a capacitor having a large capacitance as compared to the occupied area of a corresponding memory cell. As a result, improvements in the integration degree and reliability of a semiconductor memory device can be achieved.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a capacitor of a semiconductor memory device, comprising the steps of:
    preparing a semiconductor substrate;
    forming an interlayer insulating film over the semiconductor substrate;
    removing a portion of the interlayer insulating film, thereby forming a contact hole through which a surface portion of the semiconductor substrate corresponding to a region defined as a contact for the capacitor is partially exposed;
    burying tungsten in the contact hole, thereby forming a contact plug;
    forming a storage electrode on the interlayer insulating film such that the storage electrode is in electrical contact with the contact plug;
    selectively etching the storage electrode to a depth, thereby forming at least two recesses in the storage electrode; and
    sequentially forming a dielectric film and a plate electrode over the storage electrode with said at least two recesses.

2. A method in accordance with claim 1, wherein the storage electrode is made of polysilicon.

3. A method in accordance with claim 1, wherein the dielectric film has a composite structure constituted by an oxide film, a nitride film and another oxide film.

* * * * *